United States Patent
Bachmaier et al.

(10) Patent No.: US 10,355,622 B2
(45) Date of Patent: Jul. 16, 2019

(54) LIFTING SYSTEM, METHOD FOR ELECTRICAL TESTING, VIBRATION DAMPER, AND MACHINE ASSEMBLY

(71) Applicant: SIEMENS AKTIENGESELLSCHAFT, München (DE)

(72) Inventors: Georg Bachmaier, München (DE); Gerit Ebelsberger, München (DE); Detlef Gerhard, München (DE); Andreas Gödecke, München (DE); Wolfgang Zöls, München-Lochhausen (DE)

(73) Assignee: Siemens Aktiengesellschaft, München (DE)

( * ) Notice: Subject to any disclaimer, the term of this patent is extended or adjusted under 35 U.S.C. 154(b) by 477 days.

(21) Appl. No.: 15/024,726

(22) PCT Filed: Sep. 29, 2014

(86) PCT No.: PCT/EP2014/070803
§ 371 (c)(1),
(2) Date: Mar. 24, 2016

(87) PCT Pub. No.: WO2015/044420
PCT Pub. Date: Apr. 2, 2015

(65) Prior Publication Data
US 2016/0241166 A1 Aug. 18, 2016

(30) Foreign Application Priority Data

Sep. 27, 2013 (DE) .......... 10 2013 219 632
Sep. 26, 2014 (DE) .......... 10 2014 219 604

(51) Int. Cl.
*H02N 2/04* (2006.01)
*F16F 15/00* (2006.01)
(Continued)

(52) U.S. Cl.
CPC .......... *H02N 2/043* (2013.01); *F16F 15/005* (2013.01); *F16F 15/007* (2013.01);
(Continued)

(58) Field of Classification Search
CPC ...... H02N 2/043; F16F 15/005; F16F 15/007; F16F 15/027; G01R 31/2881
See application file for complete search history.

(56) References Cited

U.S. PATENT DOCUMENTS 9,625,048 B2 * 4/2017 Vu .......... F16K 27/029
2001/0003112 A1 * 6/2001 Kirchner .......... B21B 37/007
492/16
(Continued)

FOREIGN PATENT DOCUMENTS

| CN | 202883875 U | 4/2013 |
| DE | 19646847 A1 | 6/1997 |

(Continued)

OTHER PUBLICATIONS

English Translation of JP 2008263731 (Year: 2008).*
(Continued)

*Primary Examiner* — Bryan P Gordon
(74) *Attorney, Agent, or Firm* — Lempi Summerfield Katz LLC (57) ABSTRACT

The invention relates to a lifting system, comprising a piezoelectric actuator (5), a support (15), and a hydraulic stroke multiplier (10) having an input and an output side, wherein the input side of the hydraulic stroke multiplier is connected to the piezoelectric actuator (5), and the output side of the hydraulic stroke multiplier is connected to the support (15). In the method for electrically testing an electronic component, the component is placed on the support of such a lifting system and is lifted for positioning relative to a test contact. The vibration damper comprises such a lifting (Continued)

system. The machine assembly has a machine and such a vibration damper.

20 Claims, 3 Drawing Sheets

(51) Int. Cl.
    *G01R 31/28*     (2006.01)
    *F16F 15/027*     (2006.01)
    *G01R 31/26*     (2014.01)
    *H02K 5/24*     (2006.01)

(52) U.S. Cl.
    CPC ........ *F16F 15/027* (2013.01); *G01R 31/2635* (2013.01); *G01R 31/286* (2013.01); *H02K 5/24* (2013.01); *G01R 31/2881* (2013.01)

(56) References Cited

U.S. PATENT DOCUMENTS

| | | | |
|---|---|---|---|
| 2009/0115292 A1* | 5/2009 | Ueda | H02N 2/043 310/338 |
| 2009/0301140 A1* | 12/2009 | Lonati | D04B 27/00 66/207 |
| 2012/0018542 A1* | 1/2012 | Bachmaier | F02M 51/0603 239/584 |
| 2012/0119620 A1* | 5/2012 | Xu | H02N 2/043 310/328 |
| 2015/0113976 A1 | 4/2015 | Bachmaier et al. | |
| 2016/0241166 A1 | 8/2016 | Bachmaier et al. | |

FOREIGN PATENT DOCUMENTS

| | | |
|---|---|---|
| DE | 10100392 C1 | 6/2002 |
| EP | 0864743 A2 | 9/1998 |
| JP | 2008263731 A | 10/2008 |
| WO | WO2012077190 A1 | 6/2012 |
| WO | WO2013160398 A1 | 10/2013 |
| WO | WO2014001083 A1 | 10/2014 |

OTHER PUBLICATIONS

English Translation of DE 10100392 (Year: 2002).*
Chinese Office Action for related Chinese Application No. 2014 800 651 56.6 dated Mar. 27, 2017, with English Translation.
PCT International Search Report of the International Searching Authority dated Apr. 7, 2014 for corresponding PCT/EP2014/070803.
PCT International Written Opinion of the International Searching Authority dated Apr. 7, 2015 for corresponding PCT/EP2014/070803.

* cited by examiner

LIFTING SYSTEM, METHOD FOR ELECTRICAL TESTING, VIBRATION DAMPER, AND MACHINE ASSEMBLY

CROSS-REFERENCE TO RELATED APPLICATIONS

This application is the National Stage of International Application No. PCT/EP2014/070803, filed Sep. 29, 2014 that claims the benefit of German Patent Application No. DE 10 2013 219632.6, filed Sep. 27, 2013 and German Patent Application No. DE 10 2014 219604.3, filed Sep. 26, 2014. The entire contents of these documents are hereby incorporated herein by reference.

BACKGROUND

The present embodiments relate to a lifting system, to a method for electrical testing, to a vibration damper and to a machine assembly.

For the electrical testing of electronic components (e.g., for the testing of LEDs), lifting systems are commonly required that lift the electronic component on a support. During the lifting of the electronic component, a contact is placed against the electronic component such that the electronic component may have a measurement voltage applied to it for the electrical testing.

In lifting systems for this purpose, actuator are provided exhibiting both high dynamics and high positioning accuracy. Piezo actuators may combine both of these characteristics. Piezo actuators, however, disadvantageously have only a stroke range of approximately 1.5% of their length in the stroke direction (e.g., for customary piezo actuators, the stroke range amounts to only approximately 40 to 50 μm).

SUMMARY AND DESCRIPTION

The scope of the present invention is defined solely by the appended claims and is not affected to any degree by the statements within this summary. An improved lifting system for electrical testing of electronic components is provided. An improved method for the electrical testing of an electronic component is also provided.

The present embodiments also provide a vibration damper and a machine assembly. For example, during the operation of machines (e.g., large electric motors), vibrations often arise that are excited by imbalances or that are magnetically excited by a rotating magnetic flux between rotor and stator.

It is disadvantageously possible for such vibrations to be coupled into a foundation (e.g., to cause surrounding installations to vibrate). Furthermore, the vibrations may be transmitted via the rotor to a plant (e.g., compressor) that is to be driven. Aside from comfort problems (e.g., noise and human vibration), this vibration often leads to damage as a result of fatigue failure.

It is known for vibrations, generated during the operation of electric motors, to be prevented by eliminating the asymmetries that cause them (e.g., by balancing or by good magnetic design of the electric motor). However, a high level of balancing quality and a high level of homogeneity of the magnet guidance may be implemented only to a limited extent, or only at very great expense.

Furthermore, passive vibration reduction is known. For example, viscoelastic damper elements (e.g., "rubber dampers") may be provided on the machine foot. It is, however, disadvantageously also possible for quasi-steady-state forces (e.g., during the build-up of torques) to lead to deformations.

Furthermore, such as in automotive engineering, it is known to use hydraulic dampers that impart a damping action using hydraulic throttles (e.g., passively). However, by way of a build-up of preload pressure, quasi-steady-state forces may be applied such that, in the case of vehicles, active stabilization measures are possible. For example, electronically controlled active suspension system (ECASS) may be provided (e.g., Active Body Control by Mercedes Benz or Active Roll Stabilization by BMW). However, in the case of traditional systems that operate with hydraulic pumps, the response time is extremely long, and/or the limit frequency is low (e.g., a small number of Hz).

Furthermore, magnetorheological dampers are known. Normally, however, magnetorheological dampers realize merely an adjustable damping characteristic, but provide no active introduction of preload forces.

Furthermore, in buildings (e.g., high-rise buildings), bridges, overhead power lines and internal combustion engines, vibration absorbers are used for the reduction of vibrations. Vibration absorbers are composed of an absorber mass connected by an absorber spring and a damper to the system to be damped. Vibration absorbers extract, at their natural frequency, the vibration energy of the structure to be damped. All vibration absorbers disadvantageously require an additional mass, and are therefore expensive and heavy.

An improved vibration damper and an improved machine assembly is also provided.

The lifting system according to an embodiment includes at least one piezo actuator. Furthermore, the lifting system also includes a support and a hydraulic stroke multiplier with an input and an output side. The hydraulic stroke multiplier is attached on the input side to the at least one piezo actuator and on the output side to the support. The exemplary lifting system thus advantageously combines the high dynamics and the high positioning accuracy of a piezo actuator and the possibility of realizing large lift strokes with the hydraulic stroke multipliers. In this way, considerably longer lift strokes may be realized compared to conventional piezo actuators. The lifting system also exhibits a very high system stiffness, which is considerably higher than lifting systems in which the piezo actuator strokes are boosted by solid-state joints. The longer lift travel of the exemplary lifting system may be attained rapidly and reliably. It is thus possible for the exemplary lifting system to be used in time-critical applications. Furthermore, it is scarcely possible for the exemplary lifting system to be resonantly excited so as to mechanically vibrate with natural resonance, thus the exemplary lifting system substantially insusceptible to be resonantly excited so as to mechanically vibrate with natural resonance.

In the lifting system according to an embodiment, the piezo actuator is a piezo actuator with one actuation direction. The hydraulic stroke multiplier is attached on the input side in the actuation direction to the piezo actuator. The piezo actuator may be a multi-layer piezo actuator. Multi-layer piezo actuators may provide a high power density with relatively low supply voltages.

The support may be formed with a plate (e.g., that extends with its areal extent transversely with respect to the actuation direction), wherein the lifting system may form a lifting table.

In an embodiment, the hydraulic stroke multiplier includes, at the input side and at the output side, at least one piston chamber with a piston guided therein. Here, the cross sections of the at least one input-side piston chamber/of the piston chambers and of the at least one output-side piston chamber/of the piston chambers may differ from one another. A cross section of a piston chamber is understood to be a section of the piston chamber transversely (e.g., perpendicularly) with respect to a guidance direction of the piston guided in the piston chamber.

In the lifting system according to an embodiment, the hydraulic stroke multiplier may include, at the input side and at the output side, at least one corrugated bellows, wherein the cross sections of the at least one input-side and of the at least one output-side corrugated bellows may differ from one another. A cross section of a corrugated bellows is understood to be a section transversely (e.g., perpendicularly) with respect to a folding direction of the corrugated bellows (e.g., a direction along which the corrugated bellows is collapsible). For example, the cross section may run parallel to a fold, bend line or along a circumferentially running undulation peak of an undulation profile of the corrugated bellows.

In the lifting system according an embodiment, the hydraulic stroke multiplier has, at the input side, two or more elements from a group including a corrugated bellows and a piston chamber with piston guided therein. The hydraulic stroke multiplier has, at the output side, fewer elements from the abovementioned group (e.g., precisely one element). The input-side elements are hydraulically connected to the at least one output-side element.

In another embodiment of the lifting system, the input-side piston chamber(s) are connected (e.g., hydraulically) to the output-side piston chamber(s). Alternatively, the one or more input-side corrugated bellows are connected (e.g., hydraulically) to the one or more output-side corrugated bellows (e.g., by one hydraulic throttle). With the configuration of the hydraulic throttle, it is possible for the damping characteristic of the lifting system to be easily adapted.

The at least one input-side piston chamber and the at least one output-side piston chamber, in interaction with the pistons respectively guided therein, or the at least one input-side corrugated bellows and the at least one output-side corrugated bellows, each form fluid volumes, wherein the fluid volumes are coupled (e.g., connected) to one another. The fluid volumes are suitably filled with incompressible fluid (e.g., with a hydraulic fluid).

The hydraulic multiplier action of the hydraulic stroke multiplier is provided by the input-side and output-side piston chambers, and/or by the input-side and output-side corrugated bellows, which have different hydraulic cross sections and are fluidically connected to one another. Owing to the requirement for the hydraulic volume within the stroke multiplier of the lifting system to remain constant, the stroke multiplier action of the hydraulic stroke multiplier is provided as the ratio of the input-side and of the output-side hydraulic cross section (e.g., the cross sections thereof transversely with respect to the respective guidance direction of the piston or transversely with respect to the fold direction). If multiple corrugated bellows and/or piston chambers are provided at the input side, the sum of the hydraulic cross sections thereof replaces the abovementioned input-side hydraulic cross section. If multiple output-side corrugated bellows and/or piston chambers are provided, the output-side hydraulic cross section is to be understood as the sum of hydraulic cross sections thereof. In this way, it is possible for changes in volume of the input-side piston chamber arising as a result of the input-side piston movement, or changes in volume of the input-side corrugated bellows arising as a result of input-side folding of the corrugated bellows, to cause, via the hydraulic connection, corresponding changes in volume of the output-side piston chamber or of the output-side corrugated bellows. Consequently, the result is precise coupling of the input and output sides of the hydraulic stroke multiplier of the lifting system.

In the present embodiments of the lifting system in which the respective fluid volumes are realized by input-side and output-side corrugated bellows, the fluid volumes are sealed off by metallic means (e.g., metal seals). Sealing problems of such fluid volumes are therefore prevented from the outset. A stroke multiplier action is, in these embodiments, realized by flexible undulations in the bellows and the associated low axial stiffness. Here, the fluid volume may be as small as possible (e.g., such that the stiffness of the lifting system is maximized). The fluid volumes are closed off, and consequently, not subject to contamination. The lifting system may be of a durable and low-maintenance design.

Displacement bodies (e.g., composed metal) are provided in the hydraulic volumes of the piston chambers or corrugated bellows. In this case, the overall stiffness of the lifting system is greatly increased.

In the lifting system according to an embodiment, the cross section of the piston chamber at the input side is larger than the cross section of the piston chamber at the output side, or the cross section of the corrugated bellows at the input side is larger than the cross section of the corrugated bellows at the output side. In this embodiment, conversion of actuation strokes of the piezo actuator into relatively larger actuation strokes of the lifting system is provided.

In the method according to an embodiment for the electrical testing of an electronic component, the component is placed onto the support of a lifting system as described in the exemplary embodiments above, and the component is raised or lowered for the purposes of positioning relative to a test contact. By way of the lifting system as described above, a very high system stiffness is realized, and at the same time, a required stroke is effected very rapidly. By performing the method, it is possible for a test time of an electronic component to be considerably shortened (e.g., because both the time and the reliability of the lift travel required for the test are improved). Furthermore, by using hydraulics, the lifting system is intensely damped, and a "soft" lift curve is obtained (e.g., the electronic component may be raised or lowered gently). By performing the method, positioning of an electronic component relative to a test contact is provided in a manner particularly well suited to requirements. The method is carried out for the testing of an electronic component in the form of a light-emitting diode (LED).

The vibration damper according to an embodiment has a lifting system according to the embodiments as described above.

By contrast to traditional vibration absorbers (e.g., with auxiliary masses), the vibration damper according to an embodiment permits installation directly between a foundation and a machine to be damped (e.g., a foot of the machine). This is a simple, efficient and robust approach both in terms of construction and in terms of control/regulation technology.

In the past, the use of piezo actuators for vibration reduction often failed because of small deflections of piezo actuators. By way of the micro-hydraulic principle provided herein, using stroke multipliers and coupling of an arbitrary number of piezo actuators to an output-side corrugated bellows or an output-side piston chamber with piston guided therein, this limitation is effectively eliminated. Thus, according to an embodiment, it is possible to realize virtually any desired deflection of the lifting system and of the vibration damper at virtually any desired force level.

In the vibration damper according an embodiment, the support may be configured for positively locking, cohesively locking and/or non-positively locking a connection to a part of a machine (e.g., a machine foot).

In an embodiment, the vibration damper has an attachment piece and a second hydraulic stroke multiplier with an input and an output side. The second hydraulic stroke multiplier is attached on its input side to another linear actuator and on its output side to the attachment piece.

In this way, not only is it possible for vertical vibrations to be dampened (e.g., by the vibration damper with the lifting system according to the present embodiments), but it is additionally possible for vibrations in further degrees of freedom (e.g., vibrations in horizontal spatial directions) to be dampened by the second hydraulic stroke multiplier with the further linear actuator.

The vibration damper according an embodiment includes a control unit that is configured to control the piezo actuator in a first operating mode such that the total force acting on the lifting system remains constant, and/or to control the piezo actuator in a second operating mode such that the support vibrates with the least possible deflection.

In a vibration damper according an embodiment, instead of the at least one piezo actuator, at least another actuator is provided (e.g., at least one magnetic, magnetostrictive, and/or electrostrictive actuator, and/or an actuator based on the shape memory principle, such as based on the principle of magnetic shape memory).

The machine assembly according to an embodiment includes a machine (e.g., an electric motor) and at least one vibration damper as described above. At least one vibration damper is attached (e.g., by an attachment part) to the machine (e.g., to at least one foot of the machine).

The machine assembly according to an embodiment may be lightweight and in a compact form (e.g., by virtue of a typical machine foot being equipped with a vibration damper necessitating only minor changes or no changes in space requirement or weight). It is thus possible for machine assemblies according to the present embodiments to be formed with minor changes in relation to non-vibration-damped machines. For example, it is not necessary to provide space for large absorber masses. This may considerably improve customer acceptance. The reduction of vibrations of the machine is possible in different variants. The decoupling of the machine of the machine assembly and a foundation on which the machine is positioned prevents oscillating forces from being introduced into the foundation. The calming has the effect that forces are introduced into the machine such that the latter (e.g., or one or more of its parts) is prevented from vibrating. In mixed forms, a combination of the above features is provided, such that the vibration of the machine or of parts of the machine is reduced, but at the same time an introduction of force into the foundation is kept within an acceptable range.

In the present embodiments, one vibration damper is provided between a foot of the machine and a foundation on which the machine is positioned. In the case of a machine (e.g., in the form of a typical electric motor) with four feet, four vibration dampers are used (e.g. correspondingly a distributed vibration damping system).

In the case of the vibration damper according to various embodiments, and in the case of the machine assembly according to various embodiments, the lifting system may be deflected with frequencies from steady-state operation (0 Hz) up to a maximum frequency (e.g., at least 5000 cycles/min or at least 10,000 cycles/min). The lifting system may be deflected within the stated frequency range with a deflection of up to 200 micrometers (e.g., with a deflection of up to 800 micrometers).

In general, the maximum frequency is determined by the maximum operating frequency of the machine (e.g., at least 5000 cycles/min) multiplied by the number of pole pairs (e.g., at least 2), such as for a (e.g., electric) motor of the machine. The required maximum deflection is determined from the dynamic system configuration and is dependent primarily on the type of foundation (e.g., on the (e.g., absence of) stiffness of the foundation).

The required maximum deflection may lie in the range from 200 micrometers to 800 micrometers. By way of deflection of the lifting of the vibration damper according an embodiment, a controllable or regulable deflection or force is set between the foundation and machine. In this way, the examples described in more detail below for vibration reduction of the machine assembly are made available, which are expediently realized in the control device described above:

According to the present embodiments, decoupling may be provided. The vibration of the machine is decoupled from the foundation (e.g., the foundation is subjected only to quasi-steady-state forces, such as the weight of the machine and/or quasi-steady-state torque loading). For this purpose, the deflection of the piezo actuator is expediently controlled and/or regulated such that the force on the piezo actuator and/or on the output side of the hydraulic stroke multiplier is as constant as possible. For this purpose, it is advantageously the case that force sensors are integrated into the piezo actuator and/or the hydraulic stroke multiplier. The machine may thus, in effect, vibrate freely.

The motor vibration is thus not reduced in relation to the non-damped system. However, the vibrations coupled into the surroundings are suppressed or greatly reduced, which is advantageous with regard to noise or human vibration.

According to the present embodiments, calming may be provided. The deflections of the piezo actuator are controlled such that the machine or parts of the machine (e.g., a motor block, a motor shield, a motor bearing, a rotor or an axle of an electric motor) is or are prevented from vibrating (e.g., in effect "constrained"). For this purpose, forces are coupled in that the forces are substantially opposed, but of equal magnitude, to the excitation forces. For this purpose, sensors are attached to the parts to be calmed, and the amplitude, frequency and phase angle are calculated by suitable algorithms (see below). The machine vibrations are greatly reduced in this way. However, at present, high forces are introduced into the foundation that may in turn (e.g., depending on the type of construction) incite vibration of said foundation.

According to the present embodiments, mixed forms of decoupling and calming may be provided. By way of a suitable quality function, an advantageous combination of decoupling and calming is determined. For example, it may be an aim to keep a machine vibration amplitude below a certain threshold value, but to do so with the least possible introduction of force into a foundation of the machine. This may be realized in a manner dependent on the operating point (e.g. rotational frequency, applied torque), either by way of a suitable adaptive algorithm or pilot control.

In general, multiple piezo actuators with input-side corrugated bellows or piston chambers with pistons guided therein are attached. Here, all of the piezo actuators may be controlled uniformly, such that altogether (e.g., with n piezo actuators) an n-fold deflection of the lifting system with the same force may be achieved. This arrangement makes it possible to implement an identical-parts concept (e.g., the same piezo actuators are to be used) for a whole series of lifting systems and vibration dampers. Furthermore, the fail-safety of the lifting system and of the vibration damper is increased, because in the event of failure of a single piezo actuator, the entire lifting system or the entire vibration damper continues to operate, albeit with reduced performance.

For the control of multiple vibration dampers of a machine assembly according to the present embodiments, distributed control may be necessary. Known algorithms (e.g., such as the skyhook algorithm or the filtered-x LMS algorithm) may be used for this purpose.

As an alternative embodiment, a machine model is created, from measured values, permitting prediction of the expected vibration behavior at a particular frequency. On this basis, it is possible to calculate amplitudes and phases of the individual vibration dampers, which then need merely to be controlled with rotational angle synchronicity. The rotational angle of the motor may be gathered from the control (e.g., inverter) of the motor, such that simple and robust control of the vibration damper may be realized.

DETAILED DESCRIPTION

Figure 1:
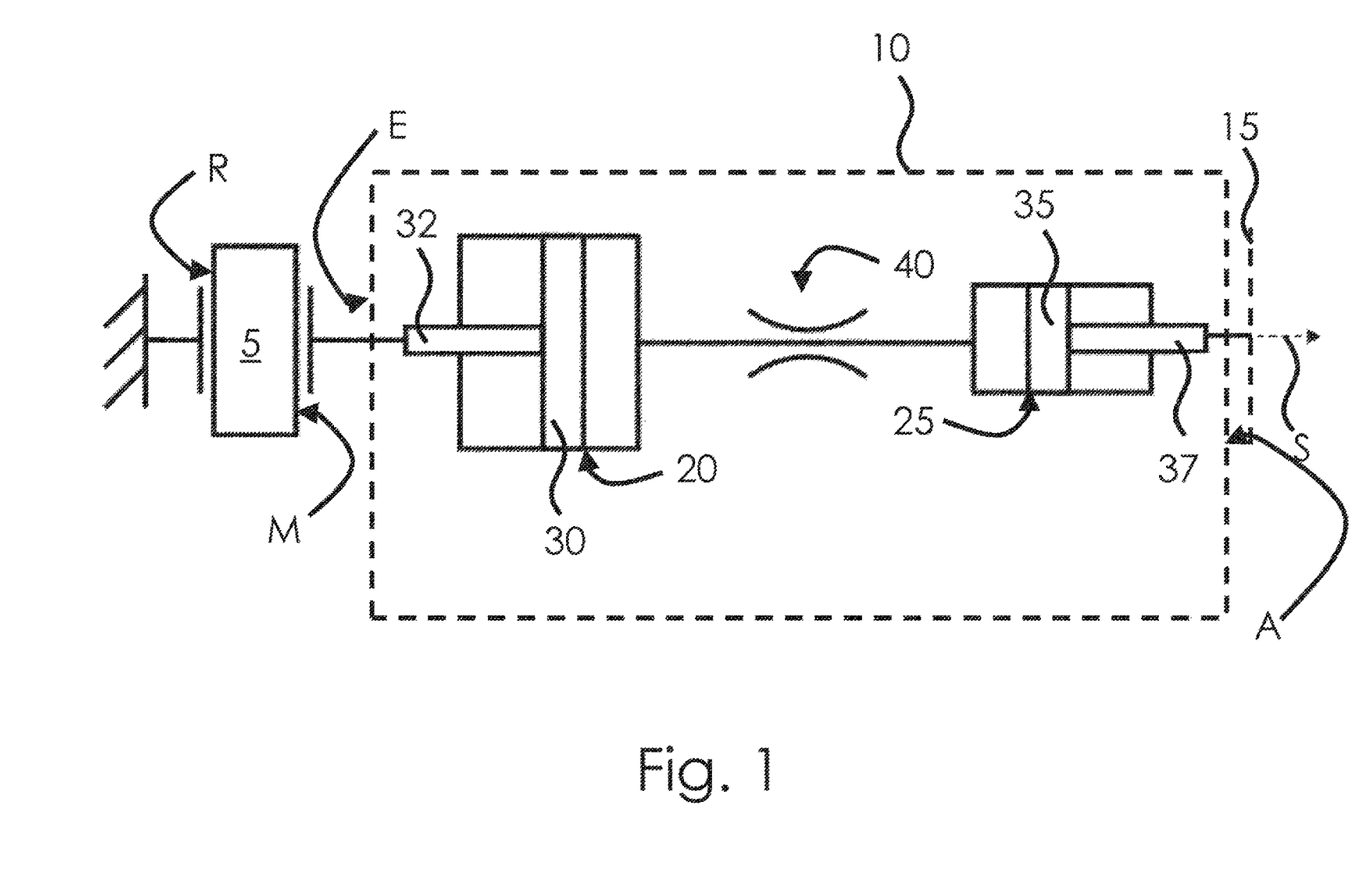
FIG. 1 shows a lifting system according to an embodiment that has a hydraulic stroke multiplier with hydraulically interconnected piston chambers.

The lifting system according to an embodiment illustrated in FIG. 1 includes a piezo actuator 5 that is configured for effecting an actuation stroke in an actuation direction S. For this purpose, the piezo actuator 5 is fixedly clamped at one side R. From that side R, the piezo actuator 5 extends in the actuation direction S with an electrically manipulable length dimension in the longitudinal direction. The piezo actuator 5 has, averted from its clamped side R, a free end M that is spaced apart to a variable extent in the longitudinal direction from the clamped side R. The free end M of the piezo actuator 5 is attached to an input side E of a hydraulic stroke multiplier 10.

The stroke multiplier 10 has an output side A that is attached to a support (e.g., lifting table panel 15). The lifting table panel 15 is indicated in FIG. 1 as a dashed vertical line.

The hydraulic stroke multiplier 10 includes an input-side piston chamber 20 and, hydraulically coupled thereto, an output-side piston chamber 25. A piston 30 is guided in the input-side piston chamber 20 to be actuated at an input side (e.g., a handle 32 leads out of the piston chamber 20 at the input side). A piston 35 is likewise guided in the output-side piston chamber 25. The piston 35 has a handle 37 that is led out of the piston chamber 25 at the output side. Both the piston 30 of the input-side piston chamber 20 and the piston 35 in the output-side piston chamber 25 are guided in the respective piston chamber 20, 25 to be movable and oppositely to the actuation direction S. The input-side piston chamber 20 and the output-side piston chamber 25 are hydraulically connected, and thus coupled, to one another via a hydraulic throttle 40.

The lifting system according to the embodiment illustrated in FIG. 1 may be operated in the following manner.

In a manner known per se, a voltage is applied to the piezo actuator 5 such that the free end M of the piezo actuator 5 deflects in the actuation direction S. The free end M of the piezo actuator 5 is rigidly coupled in terms of motion to the handle 32 of the piston 30 guided in the input-side piston chamber 20. As a result, during the deflection of the free end M of the piezo actuator 5, the piston 30 is moved in the actuation direction S within the input-side piston chamber 20.

A hydraulic oil is situated in the input-side piston chamber 20 at that side of the piston 30 that is averted from the piezo actuator 5. Consequently, in the input-side piston chamber 20, the piston 30 delimits the volume occupied by the hydraulic oil in the input-side piston chamber 20. During the movement of the piston 30 in the input-side piston chamber 20 in the actuation direction S, the volume available for the hydraulic oil within the input-side piston chamber 20 consequently decreases. As a result, hydraulic oil is displaced out of the input-side piston chamber 20 and passes via the hydraulic throttle 40 into the output-side piston chamber 25 of the hydraulic stroke multiplier 10. In the output-side piston chamber 25, the volume available for the hydraulic oil is also delimited by a piston (e.g., the piston 35 that is guided in the output-side piston chamber 25). As a result of the hydraulic oil that flows into the output-side piston chamber 25 that is likewise filled with hydraulic oil, the piston 35 that is guided in the output-side piston chamber 25 is moved in the actuation direction S. The lifting table plate 15 is rigidly coupled in terms of motion (e.g., directly fastened in the exemplary embodiment shown) to the handle 37 of the piston 35 that is guided in the output-side piston chamber 25, that piston is moved in the actuation direction S. Consequently, the lifting table panel 15 moves in the actuation direction S.

As a result of the considerably larger cross section, perpendicular to the actuation direction S of the input-side piston chamber 20 in relation to the output-side piston chamber 25, the lifting table panel 15 does not move by the same actuation stroke as that by which the free end M of the piezo actuator 5 moves in the actuation direction S (e.g., approximately 50 μm in the exemplary embodiment illustrated). Rather, the hydraulic stroke multiplier 10 has a considerably greater transmission ratio. As a result, the lifting table panel 15 moves in the actuation direction S by a stroke that is defined by the actuation travel of the free end M of the piezo actuator 5 multiplied by a transmission ratio factor>1. In the illustrated exemplary embodiment, the transmission ratio factor is a factor of 100 (e.g., the dimensions of the piston chambers 20, 25 shown in FIG. 1 are not illustrated to scale). In this way, through corresponding control of the piezo actuator 5, it is possible to realize a corresponding actuation stroke of the lifting table panel 15 of 5 millimeters in the exemplary embodiment shown.

By contrast, if the free end M of the piezo actuator 5 is moved counter to the actuation direction S, the lifting table panel 15 also moves counter to the actuation direction S by said actuation travel scaled by the transmission ratio factor of 100.

In the method according to an embodiment for the electrical testing of a light-emitting diode, the lifting system illustrated in FIG. 1 is positioned such that the actuation direction S is oriented parallel or non-parallel with respect to the direction along which the gravitational force acts. For example, the lifting system illustrated in FIG. 1 is oriented with its actuation direction S vertically (e.g., such that the lifting table panel 15 is situated above the piezo actuator 5).

For the testing of the light-emitting diode, the light-emitting diode is placed onto the lifting table panel 15. For the electrical testing of the light-emitting diode, a test contact (not explicitly shown in FIG. 1) is used that is arranged rigidly relative to the clamped end R of the piezo actuator 5. The light-emitting diode (not explicitly shown in FIG. 1) is raised or lowered by the lifting table panel 15 for positioning relative to said test contact. In this way, the light-emitting diode is brought into contact with the test contact and, in the process, has a test voltage applied to it. Electrical testing of the light-emitting diode may subsequently be performed.

Instead of the input-side piston chamber 20 with the piston 30 guided therein and the output-side piston chamber 25 with the piston 35 guided therein, it is also possible for an input-side corrugated bellows and an output-side corrugated bellows to be provided. Similar to the arrangement illustrated in FIG. 1, the corrugated bellows are hydraulically coupled to one another via a hydraulic throttle 40. Instead of the coupling of the free end M of the piezo actuator 5 to the handle 32 of the piston 30 that is guided in the input-side piston chamber 20, the free end of the piezo actuator 5 is instead coupled to that end of the input-side corrugated bellows that faces toward the free end of the piezo actuator 5. Here, the input-side corrugated bellows has a fold direction that runs along the actuation direction S as per FIG. 1. Correspondingly, an end, facing toward the lifting table panel 15, of the output-side corrugated bellows is attached to said lifting table panel. The fold direction of the output-side corrugated bellows runs oppositely to the actuation direction S as per FIG. 1. In the method according to the embodiment discussed above, it is also possible for electronic components other than a light-emitting diode to be electrically tested.

Figure 2:
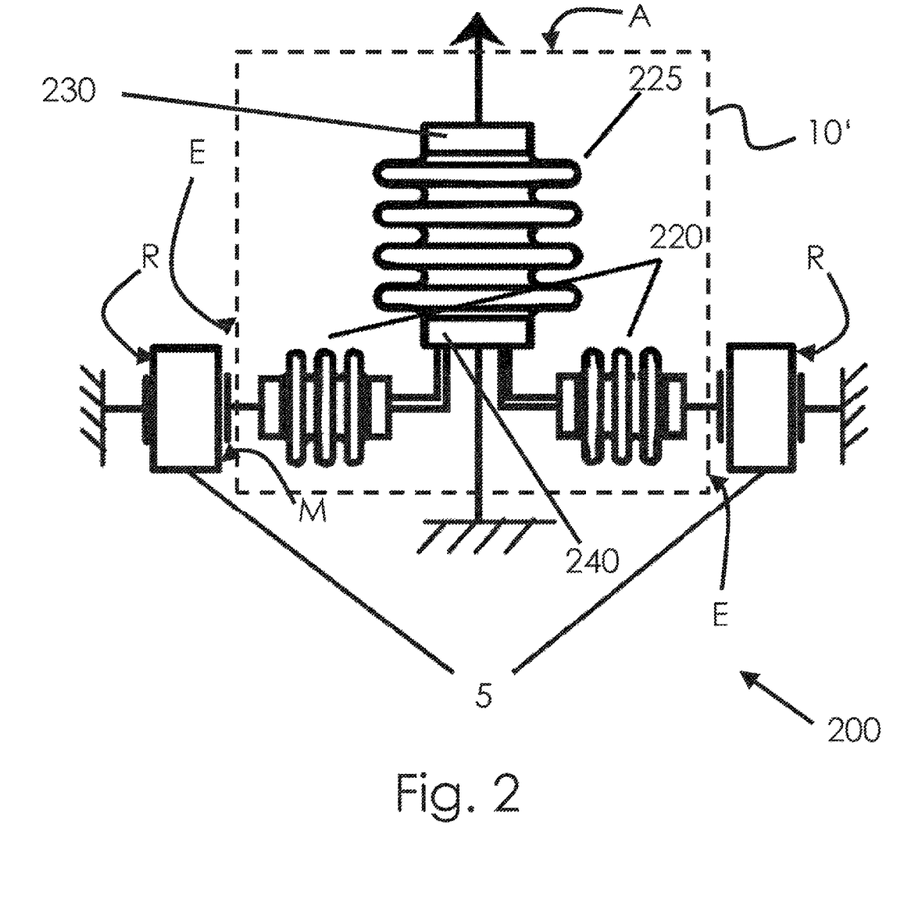
FIG. 2 shows a vibration damper according to an embodiment that is configured for the vibration damping of an electric motor.
Figure 3:
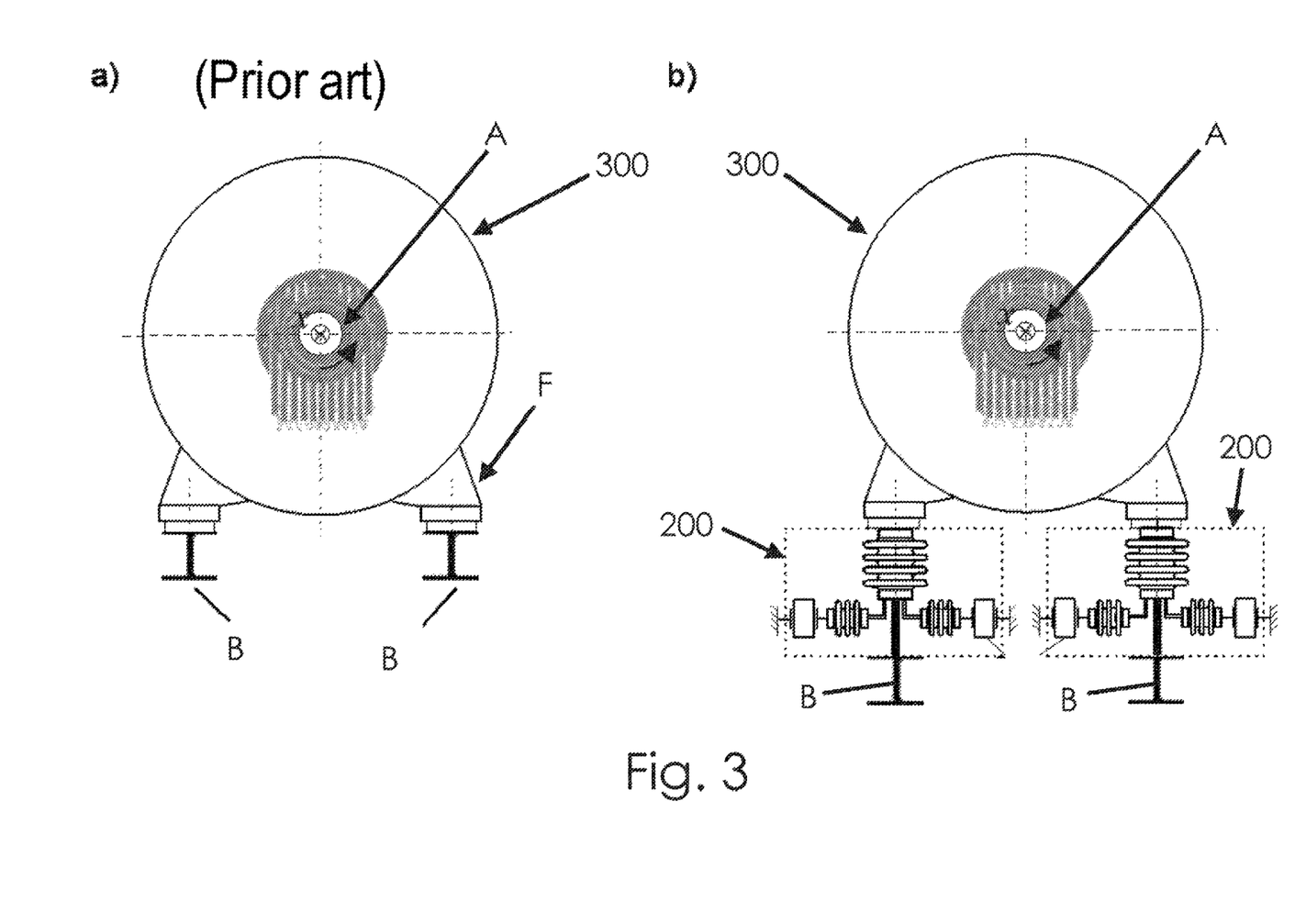
FIG. 3 shows a conventional machine (a) and a machine assembly according to an embodiment (b) with a vibration damper as shown in FIG. 2.

The vibration damper 200 according to the embodiment illustrated in FIG. 2 serves for the damping of vibrations of a machine (e.g., specifically of an electric motor 300 in the illustration of FIG. 3).

The vibration damper 200 includes four piezo actuators 5, each fixedly clamped at one side R (e.g., in the illustration as per FIG. 2, only two of these piezo actuators 5 are shown). From that side R, the piezo actuator 5 extends in the actuation direction S with an electrically manipulable length dimension in the longitudinal direction. The piezo actuator 5 thus has a free end M averted from its clamped side R. The free end is variably spaced apart from the clamped side R in the longitudinal direction. The respective free end M of the respective piezo actuator 5 is attached to an input side E of a hydraulic stroke multiplier 10'. The four piezo actuators 5 are deflected synchronously by a control device (see below).

By contrast to the exemplary embodiment illustrated in FIG. 1, the hydraulic stroke multiplier 10' illustrated in FIG. 2 includes an input-side corrugated bellows 220 instead of an input-side piston chamber 20 with piston 30 guided therein, and includes an output-side corrugated bellows 225 instead of an output-side piston chamber 25 with piston 35 guided therein. The output-side corrugated bellows is hydraulically coupled to the input-side corrugated bellows 220, similar to the arrangement illustrated in FIG. 1 (e.g., via a hydraulic throttle 40).

In a further contrast to the hydraulic stroke multiplier 10 illustrated in FIG. 1, in the hydraulic stroke multiplier 10' illustrated in FIG. 2, four input-side corrugated bellows 220 are hydraulically connected to a single output-side corrugated bellows 225. The output-side corrugated bellows 225 is, for this purpose, movable in a vertical direction (e.g., the output-side corrugated bellows 225 is collapsible in a vertical direction). The vertically upwardly extending side of the output-side corrugated bellows 225 terminates, at a face side, with a machine support 230. The machine support 230 serves as a support surface for a motor foot F of the electric motor 300 (see FIG. 3). Furthermore, the machine support 230 has a thread (not separately illustrated) that corresponds with a thread of the motor foot F. Using the thread, the motor foot F may be fixed to the machine support 230.

The input-side corrugated bellows 220 are, by contrast to the output-side corrugated bellows 225, movable horizontally (e.g., the input-side corrugated bellows 220 are collapsible in a horizontal direction). In a vertical view onto the horizontal plane, the four input-side corrugated bellows 220 extend with their horizontal directions, in which they are in each case movable/collapsible, in stellate fashion radially away from the output-side corrugated bellows 225.

The output-side corrugated bellows 220 are supported relative to a foundation B.

The machine assembly according to the embodiment illustrated in FIG. 3b (by contrast to a conventional machine a)) includes the electric motor 300 with four motor feet F and the four vibration dampers 200, to which each of the four motor feet of the electric motor 300 is connected.

The electric motor 300 includes a stator and a rotor (not shown in detail) that rotates relative to the stator (not illustrated in detail) with a frequency up to a maximum operating frequency of 5000 revolutions per minute about an axis A. The electric motor 300 has 2 pole pairs (not explicitly shown), such that the maximum frequency of vibrations encountered maximally during operation is 10,000 cycles/minute. Furthermore, during the operation of the motor in the frequency range from 0 to 10,000 cycles/minute, maximum deflections of 800 micrometers occur.

For this purpose, the vibration damper 200 according to the present embodiments has force sensors (not separately illustrated) that are each arranged at the input side on the output-side corrugated bellows 225 and detect forces acting there. Using the force sensors, the acting force is detected and transmitted to a control device (not separately shown). Using the control device, the piezo actuators 5 are controlled in terms of their deflection with respect to time such that the respectively acting force is eliminated as much as possible.

Alternatively, in a further exemplary embodiment that is not separately illustrated, it is possible for acceleration sensors to be provided instead of the force sensors. The acceleration sensors are arranged on the motor feet F or on the rotor of the electric motor 300 and detect the vibrations of the electric motor 300 in terms of amplitude, frequency and phase. The sensors transmit the detected data to a control device that controls the piezo actuator 5 such that the (e.g., spatial) amplitude of the motor vibrations is eliminated as much as possible.

In a further exemplary embodiment, mixed forms of the two abovementioned control configurations are also possible. Accordingly, a suitable quality function may be provided, the implementation of which has the effect that, for example, an amplitude of the motor vibrations is kept below a particular threshold value (e.g., with this being realized with the least possible introduction of force into the foundation B).

In a further exemplary embodiment not separately illustrated and which otherwise corresponds to the illustrated exemplary embodiment, an attachment piece for attachment to the electric motor 30, and a second hydraulic stroke multiplier are provided. The second hydraulic stroke multiplier includes an input side attached to a further linear actuator, and an output side attached to the attachment part.

In the abovementioned exemplary embodiments, the four vibration dampers 200 are controlled by distributed control (e.g., using the skyhook algorithm or the filtered-x LMS algorithm).

Alternatively, in a further exemplary embodiment, a machine model for the electric motor 300 is used. The machine model permits a prediction of the expected vibration behavior at a particular frequency. On this basis, it is possible to calculate the amplitudes and phases of the individual vibration dampers to be set, which then need merely be controlled with rotational angle synchronicity with the operating frequency of the electric motor 300. The rotational angle of the electric motor 300 may be gathered from the control (e.g., an inverter (not shown)) of the electric motor 300, such that in this way, simple and robust control of the piezo actuator 5 may be realized.

The elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent. Such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A lifting system comprising:
a plurality of piezo actuators;
a support; and
a hydraulic stroke multiplier comprising an input side and an output side, wherein the hydraulic stroke multiplier is attached to each piezo actuator of the plurality of piezo actuators on the input side and the hydraulic stroke multiplier is attached to the support on the output side, and
wherein the input side of the hydraulic stroke multiplier is positioned perpendicularly with the output side of the hydraulic stroke multiplier.

2. The lifting system of claim 1, wherein the hydraulic stroke multiplier further comprises, at the input side and at the output side, a piston chamber and a piston guided therein.

3. The lifting system of claim 1, wherein the hydraulic stroke multiplier further comprises, at the input side and at the output side, a corrugated bellows, wherein cross sections of the input-side and output-side corrugated bellows differ from one another.

4. The lifting system of claim 1, wherein the hydraulic stroke multiplier comprises, at the input side, a plurality of elements, each element of the plurality of elements comprising a corrugated bellows or a piston chamber with a piston guided therein, wherein each corrugated bellows or piston chamber is in communication with a respective piezo actuator of the plurality of piezo actuators; wherein the hydraulic stroke multiplier further comprises, at the output side, an element comprising a corrugated bellows or a piston chamber with a piston guided therein, wherein the output side comprises fewer elements than the input side.

5. The lifting system of claim 4, wherein the input-side and output-side piston chambers or the input-side and output-side corrugated bellows are hydraulically connected to one another.

6. The lifting system of claim 4, wherein the input-side and output-side corrugated bellows or the input-side and output-side piston chambers are connected to one another by a hydraulic throttle.

7. The lifting system of claim 4, wherein a cross section of the input-side piston chamber is greater than a cross section of the output-side piston chamber, or wherein a cross section of the input-side corrugated bellows is greater than a cross section of the output-side corrugated bellows.

8. A vibration damper comprising:
a lifting system, wherein the lifting system comprises:
a piezo actuator;
a support; and
a hydraulic stroke multiplier comprising an input side and an output side, wherein the hydraulic stroke multiplier is attached to the piezo actuator on the input side and the hydraulic stroke multiplier is attached to the support on the output side,
wherein the vibration damper is configured to control the piezo actuator in a first operating mode such that a total force acting on the lifting system remains constant and to control the piezo actuator in a second operating mode such that the support vibrates with the least possible deflection.

9. The vibration damper of claim 8, wherein the support is configured for positively locking, cohesively locking, non-positively locking, or a combination thereof, a connection to a part of a machine.

10. The vibration damper of claim 8, further comprising:
a linear actuator;
an attachment piece; and
a second hydraulic stroke multiplier comprising an input side and an output side, wherein the second hydraulic stroke multiplier is attached to the linear actuator on the input side and the second hydraulic stroke multiplier is attached to the attachment piece on the output side.

11. A machine assembly comprising: a machine; and a vibration damper comprising a lifting system having a piezo actuator, a support, and a hydraulic stroke multiplier, wherein the hydraulic stroke multiplier comprises an input side and an output side, and wherein the hydraulic stroke multiplier is attached to the piezo actuator on the input side and the hydraulic stroke multiplier is attached to the support on the output side, wherein the vibration damper is configured to control the piezo actuator in a first operating mode such that a total force acting on the lifting system remains constant and to control the piezo actuator in a second operating mode such that the support vibrates with a least possible deflection, and wherein the vibration damper is attached, with an attachment part, to a foot of the machine.

12. The lifting system of claim 2, wherein cross sections of the input-side piston chamber and of the output-side piston chamber differ from one another.

13. The vibration damper of claim 9, wherein the part of the machine comprises a machine foot of the machine.

14. The machine assembly of claim 11, wherein the machine comprises an electric motor.

15. The vibration damper of claim 8, wherein the hydraulic stroke multiplier further comprises, at the input side and at the output side, a piston chamber and a piston guided therein.

16. The vibration damper of claim 8, wherein the hydraulic stroke multiplier further comprises, at the input side and at the output side, a corrugated bellows, wherein cross sections of the input-side and output-side corrugated bellows differ from one another.

17. The vibration damper of claim 8, wherein the hydraulic stroke multiplier comprises, at the input side, a plurality of elements, each element of the plurality of elements comprising a corrugated bellows or a piston chamber with a piston guided therein, wherein the hydraulic stroke multiplier further comprises, at the output side, an element comprising a corrugated bellows or a piston chamber with a piston guided therein, wherein the output side comprises fewer elements than the input side.

18. The vibration damper of claim 17, wherein the input-side and output-side piston chambers or the input-side and output-side corrugated bellows are hydraulically connected to one another.

19. The vibration damper of claim 17, wherein the input-side and output-side corrugated bellows or the input-side and output-side piston chambers are connected to one another by a hydraulic throttle.

20. The vibration damper of claim 17, wherein a cross section of the input-side piston chamber is greater than a cross section of the output-side piston chamber, or wherein a cross section of the input-side corrugated bellows is greater than a cross section of the output-side corrugated bellows.

* * * * *

UNITED STATES PATENT AND TRADEMARK OFFICE
CERTIFICATE OF CORRECTION

| | |
|---|---|
| PATENT NO. | : 10,355,622 B2 |
| APPLICATION NO. | : 15/024726 |
| DATED | : July 16, 2019 |
| INVENTOR(S) | : Georg Bachmaier et al. |

It is certified that error appears in the above-identified patent and that said Letters Patent is hereby corrected as shown below:

On the Title Page

Item (74):
"LEMPI"

Should be replaced with:
"LEMPIA"

In the Claims

Column 12, Line 20:
"8. A vibration damper comprising:
a lifting system, wherein the lifting system comprises:
a piezo actuator;
a support; and
a hydraulic stroke multiplier comprising an input side and an output side, wherein the hydraulic stroke multiplier is attached to the piezo actuator on the input side and the hydraulic stroke multiplier is attached to the support on the output side,
wherein the vibration damper is configured to control the piezo actuator in a first operating mode such that a total force acting on the lifting system remains constant and to control the piezo actuator in a second operating mode such that the support vibrates with the least possible deflection."

Should be replaced with:
"8. A vibration damper comprising:
a lifting system, wherein the lifting system comprises:
a piezo actuator;
a support; and
a hydraulic stroke multiplier comprising an input side and an output side, wherein the hydraulic stroke multiplier is attached to the piezo actuator on the input side and the hydraulic stroke multiplier is attached to the support on the output side, Signed and Sealed this
Third Day of September, 2019

Andrei Iancu
*Director of the United States Patent and Trademark Office* wherein the vibration damper is configured to control the piezo actuator in a first operating mode such that a total force acting on the lifting system remains constant and to control the piezo actuator in a second operating mode such that the support vibrates with a least possible deflection."